US008796093B1

United States Patent
Cheng et al.

(10) Patent No.: US 8,796,093 B1
(45) Date of Patent: Aug. 5, 2014

(54) DOPING OF FINFET STRUCTURES

(71) Applicant: International Business Machines Corporation, Armonk, NY (US)

(72) Inventors: Kangguo Cheng, Schenectady, NY (US); Bruce B. Doris, Brewster, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/828,276

(22) Filed: Mar. 14, 2013

(51) Int. Cl.
*H01L 21/336* (2006.01)

(52) U.S. Cl.
USPC ............ 438/268; 438/542; 257/327; 257/365

(58) Field of Classification Search
None
See application file for complete search history.

(56) References Cited

U.S. PATENT DOCUMENTS

| | | | |
|---|---|---|---|
| 6,413,802 B1 | 7/2002 | Hu | |
| 8,169,024 B2 | 5/2012 | Cheng | |
| 2007/0026615 A1* | 2/2007 | Goktepeli et al. | 438/281 |
| 2007/0241399 A1* | 10/2007 | Irisawa et al. | 257/347 |
| 2009/0020819 A1* | 1/2009 | Anderson et al. | 257/365 |
| 2009/0026505 A1* | 1/2009 | Okano | 257/255 |
| 2010/0244103 A1* | 9/2010 | Chan et al. | 257/213 |
| 2011/0133285 A1* | 6/2011 | Liaw | 257/368 |
| 2011/0210404 A1* | 9/2011 | Su et al. | 257/401 |
| 2011/0291188 A1* | 12/2011 | Cheng et al. | 257/347 |
| 2011/0309333 A1* | 12/2011 | Cheng et al. | 257/24 |
| 2013/0307076 A1* | 11/2013 | Cheng et al. | 257/350 |

* cited by examiner

*Primary Examiner* — Andres Munoz
(74) *Attorney, Agent, or Firm* — Daniel P. Morris, Esq.; Otterstedt, Ellenbogen & Kammer, LLP

(57) ABSTRACT

A FinFET structure is fabricated using a process that facilitates the effective doping of fin structures. A doped layer is annealed to drive dopants into the fins. The doped layer is removed following annealing. Subsequent to removal of the doped layer, doped semiconductor material is grown epitaxially on the side walls of the fins, forming doped regions extending laterally from the fin side walls. Growth of the semiconductor material may be timed to form diamond-shaped, unmerged epitaxy.

22 Claims, 4 Drawing Sheets

DOPING OF FINFET STRUCTURES

FIELD

The present disclosure relates to the physical sciences, and, more particularly, to fin-type field effect transistor (FinFET) structures and methods of fabrication thereof.

BACKGROUND

Some types of field effect transistors (FETs) have three-dimensional, non-planar configurations including fin-like structures extending above substrates. Such field effect transistors are referred to as FinFETs. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. At least the bottom portions of the fins of bulk FinFETs should be doped to avoid source-to-drain leakage below the gate. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning. Gate-last procedures can involve making a dummy gate, fabricating other elements of the transistor, removing the dummy gate, and replacing the removed dummy gate with actual gate materials.

Doped semiconductor material such as silicon germanium (SiGe) may be provided by selective epitaxial growth on the sidewalls of the fin structure(s) during fabrication of FinFETs. Such growth results in faceted structures that, in some cases, merge into a continuous volume.

FIG. 4 is a schematic illustration of a prior art FinFET structure 20 having multiple silicon fins 22 formed from a SOI substrate 24 including base and buried oxide (BOX) layers 25, 27, the fins adjoining the BOX layer 25 and being merged by a semiconductor layer 26 subsequently grown on the substrate. The semiconductor layer 26 of the exemplary structure is comprised of doped silicon germanium grown epitaxially thereon (on the fins) which increases the volumes of the source/drain regions. Such epitaxial growth proceeds from the fins 22 to self-limited, diamond-shaped volumes Exemplary defects 28 are shown in the structure, it being appreciated that additional defects in the merged epitaxy will be present, particularly where n-doped epitaxy is employed. Unfilled areas 29 are also present near the base portions of the fins 22. Problems associated with such structures include rough merge surfaces, local unmerged areas, and defects.

FIG. 7 is a schematic illustration of a second prior art FinFET structure 40 including unmerged epitaxy in the source/drain areas. Uniform fin structures facilitate the formation of diamond-shaped volumes 44 of doped semiconductor material, for example SiGe. The epitaxial growth of ideally shaped volumes depends on various factors, including fin height, fin shape, fin spacing (pitch), fin erosion, box gauging, and fin cleaning Accidental merging of the epitaxially grown source/drain regions at one or more points should be avoided in the fabrication of such structures. The diamond-shaped volumes 44 provide only limited, non-uniform amounts of dopants to the fins 22, with relatively low amounts being provided to the bottom portions of the fins. Merge defects characterizing some FinFET structures such as the structure 20 discussed above are avoided.

SUMMARY

Principles of the present disclosure provide an exemplary fabrication method that includes obtaining a structure comprising a substrate and a plurality of parallel fins, forming a doped layer on the fins, causing dopants from the doped layer to be driven into the fins, removing the doped layer, and epitaxially forming doped source/drain regions on the fins.

A further exemplary method includes obtaining a structure comprising a substrate, a plurality of parallel fins extending from the substrate and comprised of semiconductor material, the fins having side walls and top surfaces, one or more channels defined by the side walls of the fins, and a doped layer within the one or more channels and contacting the fins such that the doped layer and fins form a merged structure, causing dopants from the doped layer to be driven into the fins, removing the doped layer, and epitaxially forming isolated doped source/drain regions on the side walls of the fins.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

FinFET structures and fabrication methods as disclosed herein can provide substantial beneficial technical effects. For example, one or more embodiments may provide one or more of the following advantages:

Uniform doping of fins;
Effective doping of fin bottom portions;
Avoidance of crystal defectivity;
Avoidance of enhanced lateral growth on isolated fin or outer fins in fin array (accidental merge of n-fin and p-fin in eDRAM regions)
Multiple fabrication steps using a single tool;

These and other features and advantages will become apparent from the following detailed description of illustrative embodiments thereof, which is to be read in connection with the accompanying drawings.

DETAILED DESCRIPTION

FinFET structures are characterized by fins formed on semiconductor substrates. Such substrates include bulk silicon substrates (fin on bulk) and SOI substrates (fin on SOI) as discussed above. Fins can further be formed on oxide over bulk silicon substrates such as bulk silicon wafers (fin on oxide over bulk). The processes discussed below are applicable to fabrication of FinFET structures where effective doping of the fins is desired. FIGS. 1-6 illustrate exemplary steps that may be performed sequentially in fabricating a FinFET structure, it being appreciated that additional steps may be necessary depending on the desired features of the FinFET structure. Fabrication may commence with a partially completed structure, in which case one or more of the steps described below could be omitted.

Figure 1A:
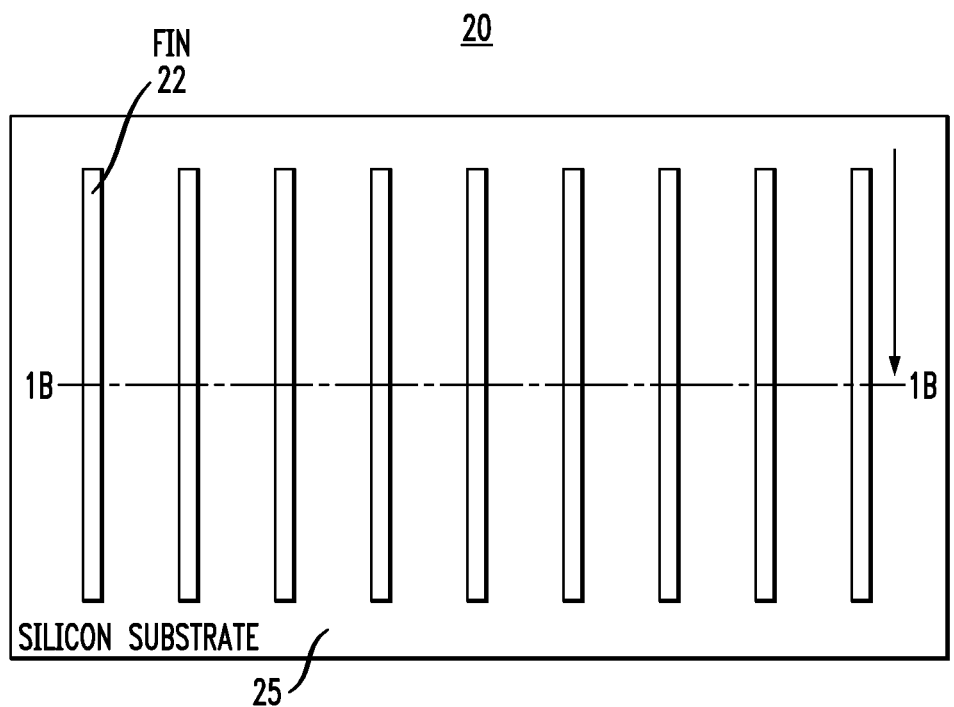
FIG. 1A is a schematic top plan illustration of a structure having silicon fins formed from a SOI substrate.
Figure 1B:
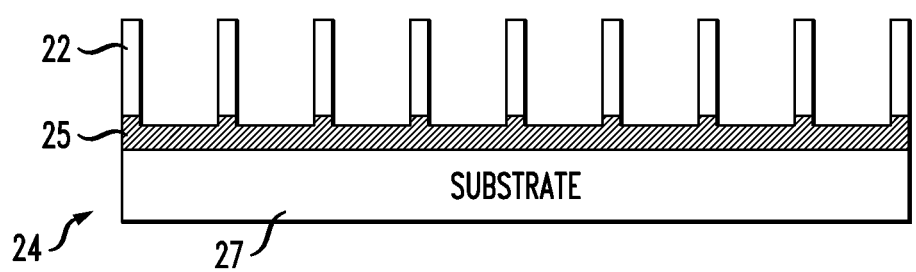
FIG. 1B is a cross sectional view thereof.

An exemplary structure 20 including crystalline silicon fins 22 formed from a SOI substrate 24 is shown in FIGS. 1A and 1B. The fin heights are commensurate with the thickness of the crystalline silicon layer of the original substrate from which they are formed. Fin heights are fifty nanometers or less in one or more exemplary embodiments discussed herein. Fin widths are twenty nanometers or less in one or more of the exemplary embodiments. The base portions of the fins 22 adjoin an insulating layer such as a buried oxide (BOX) layer 25, for example silicon dioxide. The bottom semiconductor layer 27 may comprise silicon. The SOI layer from which the fins 22 are formed and the bottom semiconductor layer 27 are not necessarily comprised of the same materials. While the fins 22 are shown as having vertical side walls and horizontal top surfaces in the schematic illustrations, it will be appreciated that fins in FinFET structures may have somewhat different configurations such as triangular configurations wherein the fin bases are wider than the tops of the fins. For example, tapered fins formed on bulk silicon substrates (not shown) facilitate filling the cavities between fins with oxide materials (not shown) without forming voids. The structure 20 may accordingly include fins having sides that are not completely vertical. Fin heights are preferably equal.

Figure 2A:
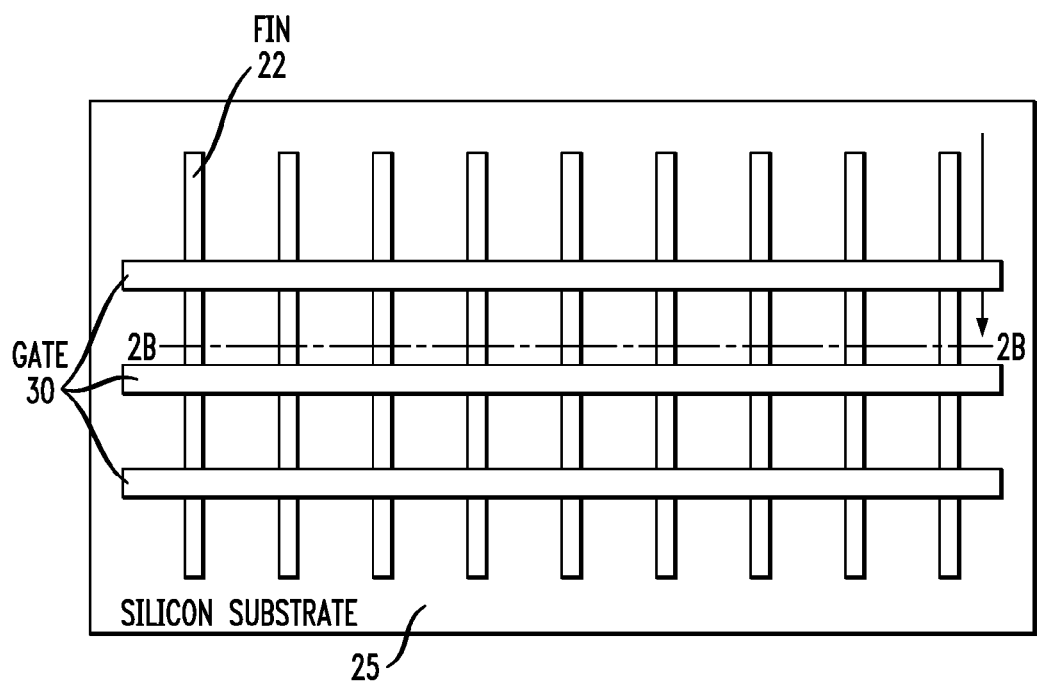
FIG. 2A is a schematic top plan illustration of the structure of FIG. 1A including gate structures formed thereon.
Figure 2B:
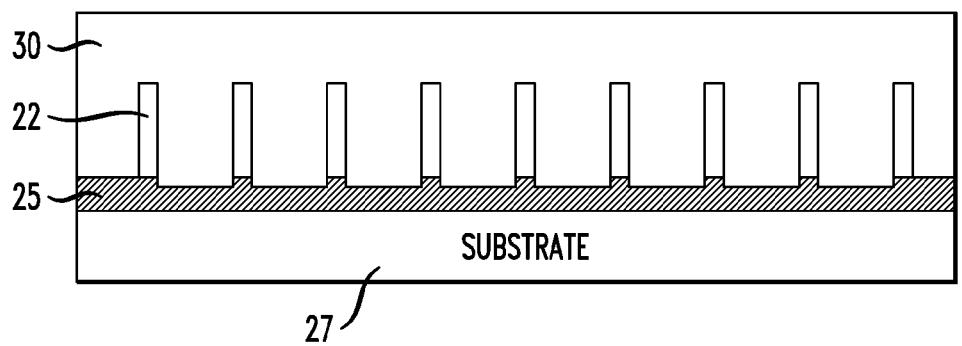
FIG. 2B is a cross sectional view thereof.
Figure 3:
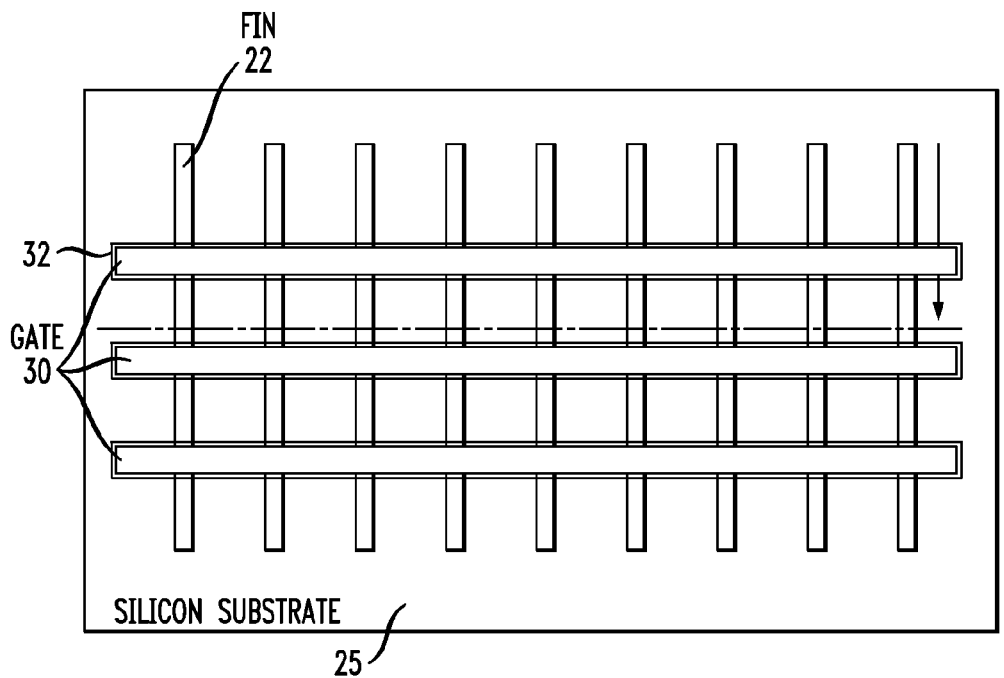
FIG. 3 is a top plan illustration of the structure of FIG. 2A showing spacers formed on the gate structures.

Referring to FIGS. 2A and 2B, gate structures 30 are formed on the finned structure 20. If a gate-first process as described above is employed, gate materials may comprise a gate dielectric (e.g., high-k such as hafnium oxide) and a gate conductor (e.g., metal gate). Any suitable deposition technique can be used to deposit high-k and metal gate, including but not limited to atomic layer deposition, chemical vapor deposition, physical vapor deposition, sputtering, plating, etc. While gate material is shown both above and between the fins 22 in the illustrated structure, it will be appreciated that it may alternatively be formed only between the fins. Dielectric spacers 32 are formed around the gate structure as shown schematically in FIG. 3. If a gate-last process is employed, a dummy gate (not shown) is formed wherein the dummy gate may comprise a dummy gate dielectric (e.g., oxide) covering fins and a dummy gate material (e.g., polysilicon) on top of the dummy gate dielectric. This dummy gate is removed in a later process familiar to those of skill in the art and a replacement metal gate composition is patterned at an appropriate stage of the transistor fabrication process. The structure shown in FIG. 3 may include further elements such as dielectric fin caps and/or other elements depending upon the fabrication method employed to produce a desired FinFET structure. Fin heights, widths and spacing are further chosen in accordance with manufacturer preferences. Fin heights in some embodiments range between 10-50 nm. The substrate in an exemplary embodiment is a (100) substrate oriented such that the side walls of the crystalline silicon fins 22 are (110) surfaces. As discussed above, the side walls of the fins 22 may not be exactly vertical. Surfaces described as (110) surfaces herein are at least close to being (110) surfaces but may or may not be exactly (110) surfaces.

Once obtaining the structure as described above with respect to FIG. 3, a layer 26 of doped material is grown epitaxially or otherwise deposited on the structure, causing the source/drain regions to be merged in accordance with conventional technology such as discussed above wherein the layer is comprised of epitaxially grown silicon germanium. The silicon germanium material, if employed, can be highly doped (4e20 or higher, with 7e20-1.3e21 preferred) as the layer 26 is provided only for the purpose of providing dopants to the fins 22. Those of skill in the art are familiar with processes for growing such a layer. Silane and germane are exemplary precursor materials for use in an epitaxial tool. The choice of semiconductor materials and dopants depends on the type of device to be fabricated and desired device characteristics. For pFET devices, boron-doped SiGe is employed in some embodiments. Phosphorus-doped SiGe is among the semiconductor materials that can be employed as the semiconductor material in other embodiments where nFET devices are fabricated. Doping levels are similar for both n-type and p-type materials. The Ge content of the SiGe may range from 40-60% germanium in some embodiments. The presence of a substantial percentage of germanium facilitates later etching of the layer 26. As discussed above, the source/drain fin merge as formed in the conventional manner using silicon germanium is often defective. Such defects do not affect device performance using the exemplary method as the material comprising the doped layer 26 is ultimately removed. In the exemplary embodiment shown in FIG. 4, growth of the doped semiconductor layer 26 is discontinued in time to avoid excessive overgrowth above the top surfaces of the fins 22. In this exemplary embodiment, overgrowth does not exceed 20 nm above the fins 22. Overgrowth exceeding 20 nm may be obtained in other embodiments of the process. The choice of doped materials used to effect doping of the fins 22 is based at least in part on their ability 1) to be selective with respect to the fins, 2) to be grown or deposited within the small channels defined by the fins, which are thirty nanometers or less in some embodiments, and 3) to be removed completely from and above the channels without leaving residue. As discussed above, epitaxially grown doped silicon germanium includes such properties. Doped polysilicon and spin-on glass (SOG) are among possible alternatives for effecting uniform fin doping.

Figure 4:
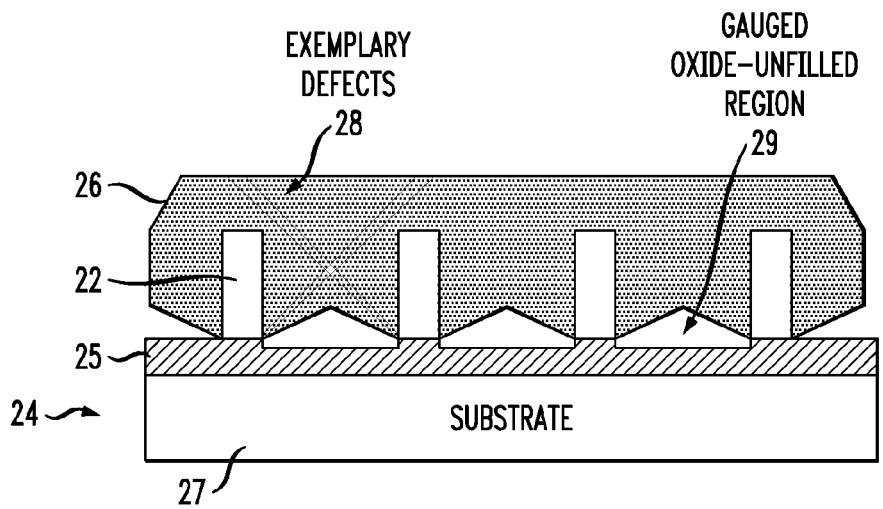
FIG. 4 is a schematic illustration of a prior art FinFET structure having merged epitaxy in the source/drain regions.

Following completion of the growth of the doped semiconductor layer 26 on the structure 20 to form the exemplary structure shown in FIG. 4, the structure is annealed to cause dopants to be driven from the doped layer into the fins 22 and beneath the spacers 32 adjoining the gate structures 30. This step can be performed in situ immediately following deposition of the layer 26 or later in a separate environment. The anneal process may be a rapid thermal anneal, furnace annealing, flash annealing, laser annealing or any suitable combination of those techniques. The annealing temperature may range from 600-1300° C. with an anneal time ranging from a millisecond to 30 minutes. Preferably, the annealing is done by a flash anneal process at about 1200° C. for twenty (20) milliseconds. The faceted structure of the doped semiconductor layer, in embodiments where the doping layer is a silicon germanium semiconductor layer, may lose its form at high dopant drive in temperatures. Effective uniform doping of the fins, including the base portions thereof, without fin damage is achievable using such annealing techniques.

Figure 5:
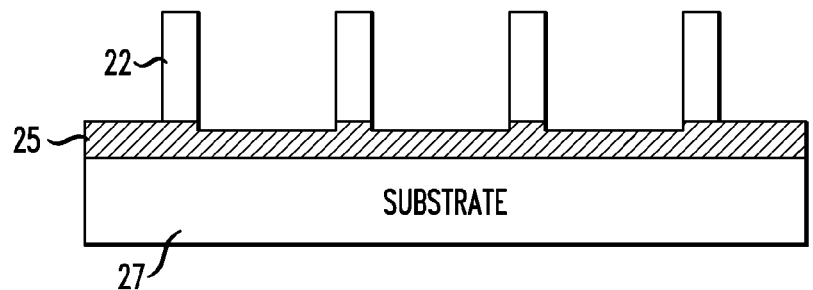
FIG. 5 is a schematic illustration of the FinFET structure of FIG. 4 following annealing and removal of the epitaxy.

The merged epitaxy is removed from the structure 20 following the annealing process. In embodiments where the material to be removed is SiGe, a hydrogen chloride (HCl) gas or wet etch can be employed to remove the doped layer 26 while leaving other elements of the structure 20 intact. Selective etching can be conducted in situ immediately following drive in annealing or at a later time. The resulting structure 50, shown in FIG. 5, is comprised of the substrate 24, the silicon fins 22 containing dopants (e.g. boron or phosphorus) from the removed doping layer 26, and other elements (not shown) such as the gate structure and spacers that are usable as transistor components or later used to form component(s) of the finished FinFET device.

Figure 6:
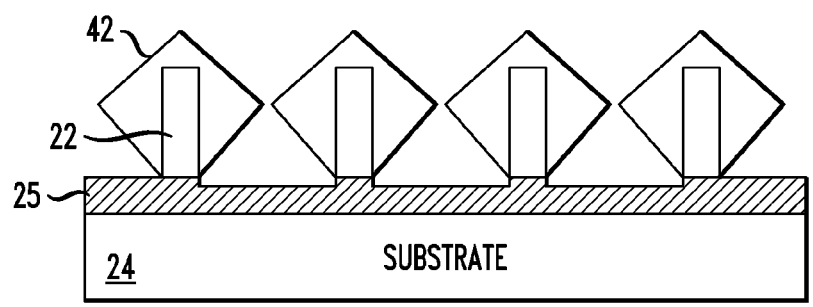
FIG. 6 is a schematic illustration of the FinFET structure of FIG. 5 following epitaxial growth of un-merged source/drain volumes.
Figure 7:
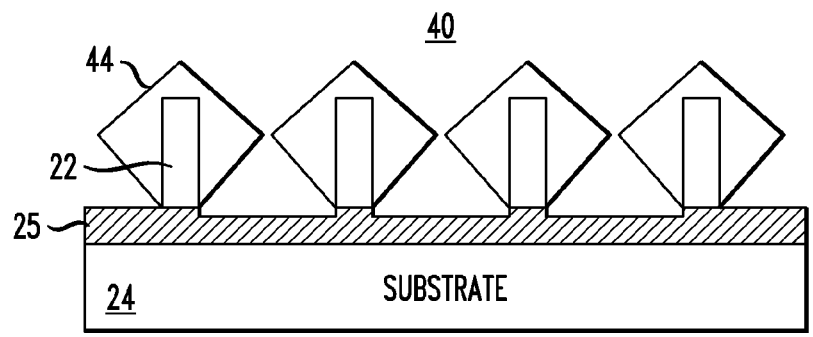
FIG. 7 is a schematic illustration of a prior art FinFET structure formed in accordance with conventional fabrication techniques.

Referring to FIG. 6, diamond-shaped volumes 42 of uniform doped semiconductor material are formed on the sidewalls of the fins 22 by epitaxial growth. As discussed above with respect to FIG. 4, faceted structures are formed on the fins as the silicon germanium (or silicon) epitaxy forms on (111) planes, thereby enlarging the source/drain regions of the fins. Fin sidewall surfaces are (110) surfaces in one or more embodiments, epitaxial growth thereon resulting in diamond-shaped structures due to the fact that the growth rate on (111) planes is considerably less than on (110) planes (100 is fastest), therefore self-limiting (111) bound diamond-shaped volumes 42 are formed. Growth is limited in this exemplary embodiment to avoid merging of the volumes, though the method described herein would also be beneficial where a merged epitaxy is formed. To employ the process described above in the fabrication of a pFET structure, boron-doped SiGe is employed in one or more embodiments for growth of both the merged epitaxy shown in FIG. 4 and the diamond-shaped volumes 42 on the sidewalls of the crystalline silicon fins 22 shown in FIG. 6. To fabricate nFET structures, phosphorus-doped SiGe is employed in one or more embodiments for growth of the merged epitaxy shown in FIG. 4 while the un-merged diamond-shaped volumes are formed with phosphorus-doped silicon (Si:P). The doping can be chosen as desired for particular transistor applications as the fins 22 are already effectively doped. Doping of the materials forming the diamond-shaped volumes or alternatively merged source/drain epitaxy can be at substantially lower levels than the materials employed for forming the doping layer 26, thereby facilitating growth of the volumes 42 or merged epitaxy with fewer defects. Exemplary doping levels of boron-doped and phosphorus doped silicon germanium used to form unmerged volumes 42 are 1e20-7e20, with 4-7e20 preferred, high doping facilitating good contact (low resistance). Doping levels lower than those employed in the removed doping layer 26 but high enough to provide the desired electrical properties would also be beneficial in reducing defects if selected epitaxial growth on the fin sidewalls following removal of the doping layer 26 results in a merged structure. In one exemplary embodiment where the doped source/drain semiconductor material is SiGe, the dopant is boron in a concentration ranging 4-7e20 and the resulting FinFET structure is p-type. Further fabrication steps are performed, some of which depend on the particular FinFET structure to be obtained. Typically the grid comprising the parallel fins and gate structures are filled with a low k dielectric material. Depending on the type of gate processing employed (gate-first or gate-last), appropriate steps are also taken to complete gate fabrication.

Given the discussion thus far and with reference to the exemplary embodiments discussed above and the drawings, it will be appreciated that, in general terms, an exemplary fabrication method includes obtaining a structure comprising a substrate and a plurality of parallel fins 22 such as shown in FIGS. 1A and 1B, forming a doped layer 26 on the fins such as shown in FIG. 4, causing dopants from the doped layer to be driven into the fins 22, removing the doped layer 26, and epitaxially forming doped source/drain regions 42 on the fins. FIG. 6 provides a schematic illustration of an exemplary resulting structure. The step of causing dopants from the doped layer to be driven into the fins includes annealing the doped layer, such as by flash annealing at high temperatures, in one or more embodiments. The step of forming a doped layer 26 on the fins 22 further includes epitaxially growing a merged, doped semiconductor layer on the fins in one or more embodiments. A merged layer may facilitate the effective doping of the fins during the annealing step. The step of epitaxially forming doped source/drain regions 42 on the fins includes forming doped source/drain regions isolated from each other, such as shown in FIG. 6, in one or more embodiments. The substrate employed in the method may be a semiconductor on insulator substrate including a semiconductor layer comprising the fins, a bulk silicon substrate, or other substrate type in which the effective doping of fins would be beneficial. The step of epitaxially forming doped source/drain regions on the fins further includes forming source/drain regions comprising silicon in some embodiments and silicon germanium in other exemplary embodiments. The method further include forming one or more gate structures, such as shown in FIGS. 2A and 2B, on the substrate and extending across the fins. The doping level of the doped layer may be greater than the doping level in the source/drain regions in some embodiments.

The fins define a plurality of parallel channels as shown in FIGS. 1A and 1B. As shown in FIG. 4, the method of forming the doped layer on the fins further includes causing the doped layer to fill the channels and extend above the top surfaces of the fins. The extent to which the doped layer extends above the fins may be limited to twenty nanometers in some embodiments. In embodiments wherein the fins comprise crystalline silicon having side walls comprising (110) surfaces, the method further includes forming the source/drain regions as isolated, diamond-shaped volumes bound by (111) surface planes as schematically illustrated in FIG. 6. The merged, doped semiconductor layer comprises silicon germanium and the source/drain regions comprise silicon in some embodiments.

Those skilled in the art will appreciate that the exemplary structures discussed above can be distributed in raw form or incorporated as parts of intermediate products or end products that benefit from having FinFET devices therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
obtaining a structure comprising a substrate including an electrically insulating layer, a plurality of parallel fins comprised of a semiconductor material, each of the plurality of parallel fins having a base portion adjoining the electrically insulating layer, and one or more gate structures extending between the plurality of parallel fins;
epitaxially forming a faceted doped layer on the plurality of parallel fins and merging the plurality of parallel fins, the faceted doped layer being comprised of a doped material selective with respect to the plurality of parallel fins;
causing dopants from the faceted doped layer to be driven into the plurality of parallel fins, thereby uniformly doping the plurality of parallel fins, including the base portions of the plurality of parallel fins;
removing the faceted doped layer, and
epitaxially forming doped source/drain regions on the plurality of parallel fins subsequent to removing the faceted doped layer.

2. The method of claim 1, wherein the step of causing dopants from the faceted doped layer to be driven into the plurality of parallel fins includes annealing the faceted doped layer.

3. The method of claim 2, wherein the faceted doped layer is a doped semiconductor layer.

4. The method of claim 3, wherein the step of epitaxially forming doped source/drain regions on the plurality of parallel fins includes forming doped source/drain regions isolated from each other.

5. The method of claim 4, wherein the step of epitaxially forming doped source/drain regions on the plurality of parallel fins further includes forming source/drain regions comprising silicon germanium.

6. The method of claim 4, wherein the step of epitaxially forming doped source/drain regions on the plurality of parallel fins further includes forming source/drain regions comprising silicon.

7. The method of claim 4, wherein the one or more gate structures comprise a gate dielectric material and a gate conductor, further including the step of forming a dielectric spacer on the one or more gate structures prior to forming the faceted doped layer.

8. The method of claim 7, wherein the step of forming the faceted doped layer on the plurality of parallel fins further includes providing a first doping level in the faceted doped layer, the step of epitaxially forming doped source/drain regions on the plurality of parallel fins further includes providing a second doping level in the source/drain regions, the first doping level being greater than the second doping level.

9. The method of claim 7, wherein the plurality of parallel fins include sidewalls and top surfaces, the sidewalls of the plurality of parallel fins defining a plurality of channels, and further wherein the step of forming the faceted doped layer on the plurality of parallel fins further includes causing the faceted doped layer to fill the plurality of channels and extend above the top surfaces of the plurality of parallel fins.

10. The method of claim 9, further including the step of limiting formation of the faceted doped layer to twenty nanometers or less above the top surfaces of the plurality of parallel fins.

11. The method of claim 4, wherein the step of annealing the faceted doped layer further includes flash annealing the faceted doped layer.

12. The method of claim 1, wherein the plurality of parallel fins comprise crystalline silicon having side walls comprising (110) surfaces.

13. The method of claim 12, further including forming the source/drain regions as isolated, diamond-shaped volumes.

14. The method of claim 13, wherein the plurality of parallel fins comprise crystalline silicon, faceted doped layer comprises silicon germanium, and the source/drain regions comprise silicon.

15. A method comprising:
obtaining a structure comprising a substrate including an electrically insulating layer, a plurality of parallel fins extending from the substrate and comprised of a semiconductor material, the plurality of parallel fins having a base portion adjoining the electrically insulating layer, side walls and top surfaces, one or more channels defined by the side walls of the plurality of parallel fins, and an epitaxial faceted doped layer within the one or more channels and contacting the plurality of parallel fins such that the epitaxial faceted doped layer and plurality of parallel fins form a merged structure;
causing dopants from the epitaxial faceted doped layer to be driven into the plurality of parallel fins, thereby uniformly doping the plurality of parallel fins, including the base portions of the plurality of parallel fins;
removing the epitaxial faceted doped layer, and
epitaxially forming isolated doped source/drain regions on the side walls of the plurality of parallel fins subsequent to removing the epitaxial faceted doped layer.

16. The method of claim 15, wherein the step of causing dopants from the epitaxial faceted doped layer to be driven into the plurality of parallel fins includes annealing the epitaxial faceted doped layer.

17. The method of claim 16, wherein the step of epitaxially forming isolated doped source/drain regions on the side walls of the plurality of parallel fins includes epitaxially forming silicon germanium source/drain regions.

18. The method of claim 16, wherein the structure further includes a gate structure extending across the plurality of parallel fins and a dielectric spacer adjoining the gate structure, further including causing dopants from the epitaxial faceted doped layer to be driven beneath the dielectric spacer.

19. The method of claim 18, further including forming the source/drain regions as isolated, diamond-shaped volumes.

20. The method of claim 19, wherein the step of annealing the doped layer includes flash annealing the epitaxial faceted doped layer.

21. The method of claim 19, wherein the substrate comprises a bulk silicon substrate.

22. The method of claim 16, wherein the plurality of parallel fins comprise crystalline silicon having side walls comprising (110) surfaces.

* * * * *